United States Patent
Nagashima et al.

(10) Patent No.: US 10,822,718 B2
(45) Date of Patent: Nov. 3, 2020

(54) METHOD FOR PRODUCING ALUMINUM NITRIDE SINGLE CRYSTAL SUBSTRATE

(71) Applicant: TOKUYAMA CORPORATION, Shunan-shi, Yamaguchi (JP)

(72) Inventors: Toru Nagashima, Shunan (JP); Reiko Okayama, Shunan (JP); Masayuki Fukuda, Shunan (JP); Hiroyuki Yanagi, Shunan (JP)

(73) Assignee: TOKUYAMA CORPORATION, Shunan-Shi (JP)

( * ) Notice: Subject to any disclaimer, the term of this patent is extended or adjusted under 35 U.S.C. 154(b) by 0 days.

(21) Appl. No.: 16/085,322

(22) PCT Filed: Mar. 22, 2017

(86) PCT No.: PCT/JP2017/011428
§ 371 (c)(1),
(2) Date: Sep. 14, 2018

(87) PCT Pub. No.: WO2017/164233
PCT Pub. Date: Sep. 28, 2017

(65) Prior Publication Data
US 2019/0093255 A1 Mar. 28, 2019

(30) Foreign Application Priority Data
Mar. 23, 2016 (JP) .................. 2016-057838

(51) Int. Cl.
*C30B 25/20* (2006.01)
*C23C 16/01* (2006.01)
(Continued)

(52) U.S. Cl.
CPC .............. *C30B 25/20* (2013.01); *C23C 16/01* (2013.01); *C23C 16/34* (2013.01); *C30B 23/025* (2013.01);
(Continued)

(58) Field of Classification Search
CPC ....... C23C 16/01; C23C 16/34; C30B 23/025; C30B 25/20; C30B 29/403; C30B 33/08; H01L 21/02024; H01L 21/205
See application file for complete search history.

(56) References Cited

U.S. PATENT DOCUMENTS

2005/0166835 A1    8/2005  Koukitsu et al.
2009/0056618 A1*  3/2009  Yoshida .................. C30B 25/02
                                                      117/84
(Continued)

FOREIGN PATENT DOCUMENTS

JP       2003-303774 A    10/2003
JP       2009-57260 A     3/2009
(Continued)

OTHER PUBLICATIONS

Marz, High Resolution X-Ray Diffraction, pp. 1-39, 2009 (Year: 2009).*

(Continued)

*Primary Examiner* — Hua Qi
(74) *Attorney, Agent, or Firm* — Birch, Stewart, Kolasch & Birch, LLP

(57) ABSTRACT

A method for producing an AlN single crystal substrate, the method including: i) preparing a first base substrate consisting of a first AlN single crystal; ii) growing a first AlN single crystal layer over a main face of the first base substrate, to obtain a layered body; iii) cutting the first MN single crystal layer of the layered body, to separate the layered body into a second base substrate and a first part of the first AlN single crystal layer, the second base substrate including the first base substrate and a thin film layered thereon, the thin film being a second part of the first AlN single crystal layer; iv) polishing a surface of the thin film, to obtain a third base substrate consisting of a second AlN single crystal; and v)

(Continued)

growing a second AlN single crystal layer over the polished surface of the third base substrate.

13 Claims, 4 Drawing Sheets

(51) Int. Cl.
    *C23C 16/34*     (2006.01)
    *H01L 21/205*     (2006.01)
    *C30B 23/02*     (2006.01)
    *C30B 29/40*     (2006.01)
    *C30B 33/08*     (2006.01)
    *H01L 21/02*     (2006.01)

(52) U.S. Cl.
    CPC ............ *C30B 29/403* (2013.01); *C30B 33/08* (2013.01); *H01L 21/02024* (2013.01); *H01L 21/205* (2013.01)

(56) References Cited

U.S. PATENT DOCUMENTS

2010/0193664 A1*   8/2010   Stoddard ................. C30B 11/14
                                                        249/114.1
2012/0063987 A1*   3/2012   Pimputkar ............. C30B 7/105
                                                        423/409
2015/0247260 A1*   9/2015   Koukitu ................. C30B 25/165
                                                       428/220
2015/0249122 A1*   9/2015   Hironaka ................ C30B 29/68
                                                       257/76

FOREIGN PATENT DOCUMENTS

| | | |
|---|---|---|
| JP | 2009-517329 A | 4/2009 |
| JP | 2009-532313 A | 9/2009 |
| JP | 2015-531739 A | 11/2015 |
| WO | WO 2007/062250 A2 | 5/2007 |
| WO | WO 2007/123735 A1 | 11/2007 |
| WO | WO 2014/031119 A1 | 2/2014 |
| WO | WO 2014/042054 A1 | 3/2014 |

OTHER PUBLICATIONS

International Preliminary Report on Patentability and English translation of Written Opinion of the International Searching Authority, dated Sep. 25, 2018, issued in PCT/JP2017/011428 (Forms PCT/IB/373 and PCT/ISA/237).

International Search Report, issued in PCT/JP2017/011428, dated Jun. 6, 2017.

Makarov et al., "Experimental and theoretical analysis of sublimation growth of AlN bulk crystals", Journal of Crystal Growth, vol. 310, 2008 (available online Nov. 19, 2007), pp. 881-886 (6 pages).

* cited by examiner

METHOD FOR PRODUCING ALUMINUM NITRIDE SINGLE CRYSTAL SUBSTRATE

TECHNICAL FIELD

The present invention relates to a novel production method of an aluminum nitride single crystal substrate, and in more detail relates to a novel production method of an aluminum nitride single crystal substrate including iteratively using a base substrate as a base substrate for growing an aluminum nitride single crystal layer thereon.

BACKGROUND ART

Aluminum nitride single crystal substrates are useful as substrates for electronic devices such as deep ultraviolet light emitting devices and high voltage Schottky diodes. Currently, aluminum nitride single crystal substrates are usually produced by a process including, in the sequence set forth: supplying raw materials including an aluminum source and a nitrogen source onto a base substrate, to grow an aluminum nitride single crystal layer over the base substrate; separating the base substrate and the aluminum nitride single crystal layer, and processing this obtained aluminum nitride single crystal layer by e.g., polishing, to produce an aluminum nitride single crystal substrate having desired surface properties. Examples of methods to grow an aluminum nitride single crystal layer over a base substrate include: a sublimation method which sublimes aluminum nitride as the aluminum source and the nitrogen source (for example, see Patent Literatures 1 and 2); and hydride vapor phase epitaxy (HVPE) which uses an aluminum trihalide gas as the aluminum source and ammonia gas as the nitrogen source gas (for example, see Patent Literature 3).

Production methods of gallium nitride single crystals have been well established, and thick gallium nitride single crystal layers can be produced. In contrast, aluminum nitride single crystals are easier to break than gallium nitride single crystals, and raw material gases of the former are more reactive than those of the latter. Therefore, it has been difficult to grow thick aluminum nitride single crystal layers. For example, growth of aluminum nitride over a sapphire substrate or a SiC substrate has been liable to suffer crack formation in aluminum nitride during growth or during cooling after growth, due to differences of lattice constants and thermal expansion coefficients between a base substrate and aluminum nitride. And also, it has been difficult to grow a thick aluminum nitride single crystal layer of good crystallinity by direct application of a void assisted separation method (i.e., masking a sapphire base substrate with titanium and then growing a thick gallium nitride single crystal layer) to aluminum nitride.

CITATION LIST

Patent Literature

Patent Literature 1: JP 2009-517329 A
Patent Literature 2: JP 2009-532313 A
Patent Literature 3: JP 2003-303774 A

SUMMARY OF INVENTION

Technical Problem

A sublimation method is known as a method to produce a thick aluminum nitride single crystal layer (for example, see Patent Literatures 1 and 2). In this method, an aluminum nitride single crystal layer which has grown over a base substrate also grows in lateral directions, and thus gradually forms an aluminum nitride single crystal of a larger diameter. An aluminum nitride single crystal substrate of a larger diameter is usually more advantageous for uses such as semiconductor device substrates, in view of improving yield.

A larger aluminum nitride single crystal substrate may be produced by: separating the aluminum nitride single crystal layer grown over the base substrate; and iteratively growing an aluminum nitride single crystal layer over the separated aluminum nitride single crystal layer as a base substrate.

However, it has been found that using a substrate obtained from an aluminum nitride single crystal layer grown over a base substrate as a new base substrate has the following drawback. That is, aluminum nitride single crystal layers grown by iteratively separating a thick aluminum nitride single crystal layer grown over a base substrate as a new base substrate are prone to have a greater variance in quality.

An object of the present invention is to provide a method which can iteratively produce aluminum nitride single crystal layers with more stable crystal qualities.

Solution to Problem

The inventors investigated the cause of the variance, so as to solve the problem. They conducted the following experiments. First, they cut a thick aluminum nitride single crystal layer grown over a base substrate by means of a single wire saw and took a plurality of aluminum nitride single crystal substrates, and prepared a plurality of base substrates under the same polishing conditions of growth surfaces (main faces). Then, they further grew an aluminum nitride single crystal layer over each base substrate, and measured properties of each aluminum nitride single crystal layer, and found that these aluminum nitride single crystal layers had variance in quality. From this result, it was presumed that the variance did not develop during growth of each aluminum nitride single crystal layer, but that the cause of the variance lied in each base substrate prepared from the thick aluminum nitride single crystal layer.

Further, the cause of the variance was presumed as follows: that is, a greater thickness of an aluminum nitride single crystal layer requires a longer growth time, which leads to an increased probability for the aluminum nitride single crystal layer to contain impurities, foreign substances, voids, crystal defects, etc., due to irregular changes such as deterioration of members in a crystal growth apparatus or formation of deposits. Use of the part containing the impurities, foreign substances, voids, crystal defects, etc., as a new base substrate leads to production of an aluminum nitride single crystal layer having deteriorated crystal qualities, or production of an aluminum nitride single crystal layers having different crystal qualities every time a base substrate is changed.

From the results above, the inventors considered that iteratively using a base substrate as many times as possible would reduce variance of qualities and properties of produced aluminum nitride single crystals, and found conditions which makes it possible to repeatedly use a base substrate, and thus completed an invention.

The present invention is a method for producing an aluminum nitride single crystal substrate, the method comprising: i) preparing a first base substrate consisting of a first aluminum nitride single crystal, the first base substrate having a main face; ii) growing a first aluminum nitride single crystal layer having a thickness of no less than 500 µm over the main face of the first base substrate, to obtain a layered body comprising the first base substrate and the first aluminum nitride single crystal layer grown over the main face of the first base substrate, wherein the ii) comprises supplying an aluminum source and a nitrogen source onto the main face of the first base substrate; iii) cutting the first aluminum nitride single crystal layer of the layered body, to separate the layered body into a second base substrate and a first part of the first aluminum nitride single crystal layer, the second base substrate comprising the first base substrate and a thin film layered thereon, the thin film being a second part of the first aluminum nitride single crystal layer; iv) polishing a surface of the thin film in the second base substrate, to obtain a third base substrate consisting of a second aluminum nitride single crystal; and v) growing a second aluminum nitride single crystal layer over the polished surface of the third base substrate.

As the main face of the first base substrate, any one of a (001) face, a (010) face, and a (100) face can be employed.

In view of iteratively using a base substrate in a more efficient and reliable manner, the thin film in the second base substrate preferably has a thickness of 1 to 300 µm.

In view of producing aluminum nitride single crystal substrates with more stable qualities and increasing the number of iteration of a base substrate, preferably, the third base substrate comprises the thin film which has been polished in the iv); and the polished thin film has a thickness of no more than 100 µm.

In view of producing aluminum nitride single crystal substrates with further stable qualities, preferably, the iv) comprises removing all of the thin film by polishing, such that the first base substrate is exposed on a surface.

In view of growing a thicker aluminum nitride single crystal layer over a base substrate, the first base substrate preferably has a dislocation density of no more than $10^6$ $cm^{-2}$ in the main face.

In view of improving the quality of an aluminum nitride single crystal layer, preferably, the main face of the first base substrate is a (001) face, a (100) face, or a (110) face; and an X-ray omega rocking curve of a specific crystal face has a half width of no more than 200 arcsec, wherein the X-ray omega rocking curve is measured under a condition that an incident angle between an incident X-ray and the main face is no more than 4°. Here, when the main face is the (001) face, the specific crystal face is a (103) face; when the main face is the (100) face, the specific crystal face is a (106) face; and when the main face is the (110) face, the specific crystal face is a (114) face. In this description, "an incident angle between an incident X-ray and the main face" means the angle between the main face and the incident X-ray. For example, when the X-ray travels in a direction perpendicular to the main face, "an incident angle between an incident X-ray and the main face" is 90°.

The producing method of an aluminum nitride single crystal substrate of this invention is preferable when the aluminum source is an aluminum halide gas; and the nitrogen source is ammonia gas.

In view of increasing a range of a use of produced aluminum nitride single crystal substrates and growing a thicker aluminum nitride single crystal layer over a base substrate, preferably, the main face of the first base substrate is a (001) vicinal face inclined from the (001) face at a first inclination angle of 0.00 to 1.00° to a m-axis and at a second inclination angle of 0.00 to 1.00° to an a-axis; and at least one of the first and second inclination angles is greater than 0.00°.

The v) preferably comprises carrying out the i) to iv) using the third base substrate as a new first base substrate.

Preferably, the producing method further comprises: repeating the v).

The iii) preferably comprises cutting the first aluminum nitride single crystal layer by means of a wire saw.

Advantageous Effects of Invention

The producing method of an aluminum nitride single crystal substrate of the present invention makes it possible to iteratively produce aluminum nitride single crystal layers with stable crystal qualities.

DESCRIPTION OF EMBODIMENTS

Figure 1:
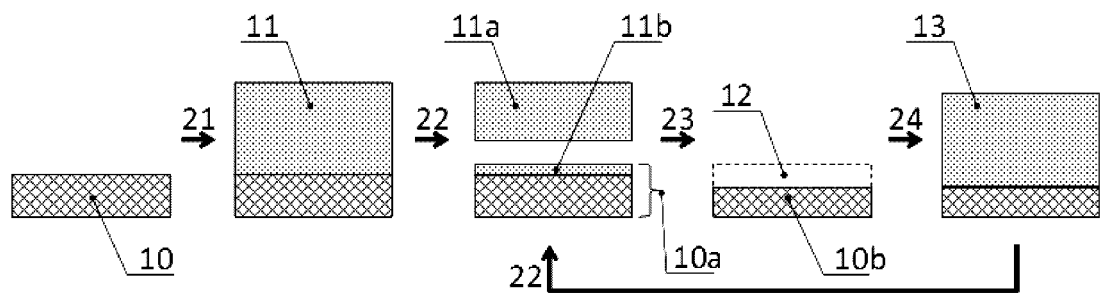
FIG. 1 explanatorily shows steps in a producing method according to one embodiment of the present invention.

The embodiments of the present invention will be described hereinafter with reference to the drawings. The present invention is not restricted to these embodiments. The drawings do not always represent precise measurements. In the drawings, some reference sings may be omitted. Expression "A to B" concerning numeral values A and B means "no less than A and no more than B" unless otherwise specified in this description. If a unit is added only to the numeral value B in such expression, this unit is applied to the numeral value A as well. A word "or" means a logical sum unless otherwise specified.

Figure 2:
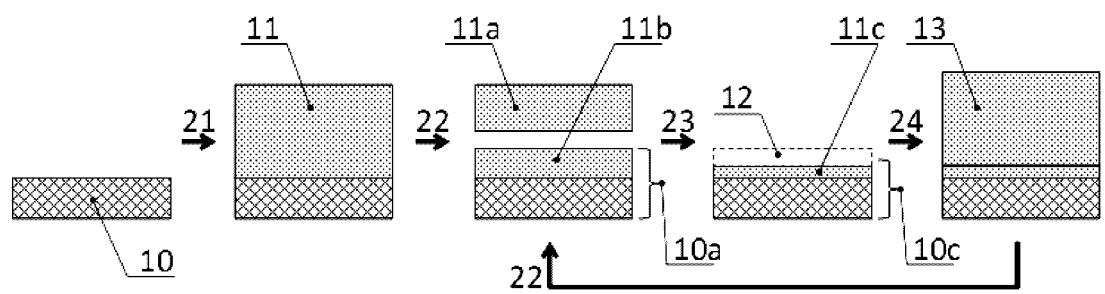
FIG. 2 explanatorily shows steps in a producing method according to another embodiment of the present invention.

The present invention is a method for producing an aluminum nitride single crystal substrate comprising: supplying an aluminum source and a nitrogen source onto a base substrate consisting of an aluminum nitride single crystal; growing an aluminum nitride single crystal layer over the base substrate; and thereafter separating the base substrate and the aluminum nitride single crystal layer. The present invention is also a method for producing an aluminum nitride single crystal substrate with stable crystal qualities comprising using the base substrate again. FIG. 1 explanatorily shows steps in one embodiment of the present invention. FIG. 2 explanatorily shows steps in a producing method according to another embodiment of the present invention. Hereinafter they will be described in order.

The aluminum source and the nitrogen source will be described in relation to a growth step. The base substrate will be described in relation to a preparation step. Separating the base substrate and the aluminum nitride single crystal layer will be described in relation to a separation step.

The method for producing an aluminum nitride single crystal substrate of the present invention comprises the steps of:

a preparation step of preparing a base substrate 10 consisting of an aluminum nitride single crystal;

a growth step of growing an aluminum nitride single crystal layer 11 having a thickness of no less than 500 µm over a main face of the base substrate, to obtain a layered body comprising the base substrate 10 and the aluminum nitride single crystal layer 11 grown over the main face of the base substrate 10;

a separation step of cutting the aluminum nitride single crystal layer 11 of the layered body, to separate the layered body into a base substrate 10a including a thin film that is at least part of the aluminum nitride single crystal layer layered thereon (hereinafter may be simply referred to as "cut base substrate 10a"), and another part of the aluminum nitride single crystal layer (hereinafter may be simply referred to as "aluminum nitride single crystal self-supporting substrate 11a");

a renewing polishing step of polishing a surface of the thin film (the residual thin film after cutting may be simply referred to as "aluminum nitride single crystal thin film 11b" hereinafter) in the base substrate (cut base substrate 10a), to obtain a renewed base substrate 10b or 10c; and a repetition step of growing an aluminum nitride single crystal layer (hereinafter may be simply referred to as "new aluminum nitride single crystal layer 13") over the polished surface of the renewed base substrate 10b or 10c.

(Preparation Step)

In the present invention, the preparation step is a step of preparing the base substrate 10. This base substrate 10 consists of an aluminum nitride single crystal.

(Base Substrate)

A surface of the base substrate over which the aluminum nitride single crystal layer 11 is grown, that is, the main face, is not specifically limited. Since the aluminum nitride single crystal self-supporting substrate 11a with a stable quality can be produced in the present invention, a crystal face of the main face is not limited as long as an aluminum nitride single crystal can be grown. Therefore, for example, the main face may be a low-index face such as a (112) face. In view of usefulness of the obtained aluminum nitride single crystal self-supporting substrate 11a and easy growth of the aluminum nitride single crystal layer 11, the main face is preferably a (001) face, a (110) face, or a (100) face.

As will be described below, a main face of the base substrate used in the repetition step has a crystal face index corresponding to the main face of the base substrate prepared in this preparation step. That is, when the base substrate whose main face is a (001) face is prepared in the preparation step, the main face of the base substrate used in the repetition step is a (001) face, and a main face of the finally obtained aluminum nitride single crystal substrate 11a is also a (001) face. A (001) face indicates a C face. If this face is a main face, a C face or a –C face is regarded as the main face. When a (110) face is used as the main face of the base substrate, the main face of the finally obtained aluminum nitride single crystal substrate 11a is also a (110) face. When a (100) face is used as the main face of the base substrate, the main face of the finally obtained aluminum nitride single crystal substrate 11a is also a (100) face.

The main face of the base substrate 10 may have an offset angle of 0.00 to 1.00°, more preferably 0.05° to 0.70°, and further preferably 0.10° to 0.40° from the surface where the aluminum nitride single crystal layer 11 is grown. Having such an offset angle can make the aluminum nitride single crystal layer 11 thicker. While the main face of the base substrate prepared in the preparation step corresponds to the main face of the base substrate (renewed base substrate 10b or 10c) used in the repetition step as described above, this offset angle (offset angle of the renewed base substrate 10b or 10c) can be adjusted in the renewing polishing step.

Among the above, when the main face of the base substrate 10 is a (001) face, preferably, the main face of the base substrate 10 inclines from the (001) face at an angle of 0.00 to 1.00° to a m-axis and at an angle of 0.00 to 1.00° to an a-axis; and at least one of the inclination angles of the main face to the m-axis and the a-axis is greater than 0.00°. Having an offset angle in this range can make the aluminum nitride single crystal layer 11 thicker. In order to make the aluminum nitride single crystal layer 11 further thicker when the main face of the base substrate 10 is a (001) face, the main face of the base substrate 10 more preferably inclines from the (001) face at an angle of 0.05° to 0.70° to the m-axis, and further preferably inclines from the (001) face at an angle of 0.10° to 0.40° to the m-axis; and more preferably inclines from the (001) face at an angle of 0.05° to 0.70° to the a-axis, and further preferably inclines from the (001) face at an angle of 0.10° to 0.40° to the a-axis. When the main face of the base substrate 10 in the preparation step is a (001) face, the main face of the finally obtained aluminum nitride single crystal self-supporting substrate 11a is also a (001) face. The aluminum nitride single crystal self-supporting substrate 11a whose main face is a (001) face can be widely used as a substrate for light emitting devices and electronic devices.

Similarly, when the main face of the base substrate 10 is a (110) face, preferably, the main face of the base substrate 10 inclines from the (110) face at an angle of 0.00 to 1.00° to a c-axis and at an angle of 0.00 to 1.00° to a m-axis; and at least one of the inclination angles of the main face to the c-axis and the m-axis is greater than 0.00°.

When the main face of the base substrate 10 is a (100) face, preferably, the main face of the base substrate 10 inclines from the (100) face at an angle of 0.00 to 1.00° to a c-axis and at an angle of 0.00 to 1.00° to an a-axis; and at least one of the inclination angles of the main face to the c-axis and the a-axis is greater than 0.00°.

An aluminum nitride single crystal substrate having a crystal face direction which is generally called a non-polar face, such as a (110) face and a (100) face, can improve an internal quantum efficiency in light emitting diodes, to contribute to improvement of performance of light emitting diodes.

Preferably, the main face of the base substrate 10 (the surface where the aluminum nitride single crystal layer 11 is grown) is a (001) face, a (110) face, or a (100) face; and an X-ray omega rocking curve of a specific crystal face has a half width of no more than 200 arcsec, wherein the X-ray omega rocking curve is measured under a condition that an incident angle between an incident X-ray and the main face is no more than 4°. Here, when the main face is a (001) face, the specific crystal face is a (103) face; when the main face is a (110) face, the specific crystal face is a (114) face; and when the main face is a (100) face, the specific crystal face is a (106) face. The incident angle between the incident X-ray and the main face is more preferably no more than 2°. In view of current measurement techniques, the lower limit of the incident angle between the incident X-ray and the main face is 0.1°. When the X-ray omega rocking curve of the specific crystal face of the base substrate is measured, the base substrate 10 is irradiated with an X-ray at a narrow incident angle. Thus, a value of a half width of the X-ray omega rocking curve reflects crystal qualities in the neighborhood of the crystal surface. Therefore, measuring a half width of the X-ray omega rocking curve of the specific crystal face makes it possible to determine, in particular, whether or not a damaged layer formed by polishing are reduced. In the base substrate 10, the X-ray omega rocking curve of the specific crystal face of which has a half width of the upper limit or below, a damaged layer in the growth surface (main face) of the base substrate is reduced. Therefore, using the base substrate 10, the X-ray omega rocking curve of the specific crystal face of which has a half width of the upper limit or below, improves the quality of the aluminum nitride single crystal layer 11 grown over the base substrate 10. In view of improving the quality of the aluminum nitride single crystal layer 11, the X-ray omega rocking curve of the specific crystal face more preferably has a half width of no more than 100 arcsec, and further preferably has a half width of no more than 50 arcsec. While a narrower half width is more preferable, the half width is preferably no less than 10 arcsec in view of industrial production of the base substrate 10.

In measurement of the X-ray omega rocking curve of the specific crystal face, since the means for monochromation of an X-ray source affects resolution of the measured half-width, an X-ray source monochromated by being diffracted twice by the (220) face of a germanium single crystal is preferably used.

Further, preferably, the main face of the base substrate 10 (the surface where the aluminum nitride single crystal layer 11 is grown) is a (001) face, a (110) face, or a (100) face; and an X-ray omega rocking curve of an inclined crystal face has a half width of no more than 100 arcsec, wherein the X-ray omega rocking curve is measured under a condition that an incident angle between an incident X-ray and the main face is no less than 10°. Here, when the main face is a (001) face, the inclined crystal faces are a (002) face and a (101) face, the X-ray omega rocking curves of both of which preferably have a half width of the above described upper limit or below; when the main face is a (110) face, the inclined crystal faces are a (110) face and a (111) face, the X-ray omega rocking curves of both of which preferably have a half width of the above described upper limit or below; and when the main face is a (100) face, the inclined crystal faces are a (100) face and a (201) face, the X-ray omega rocking curves of both of which preferably have a half width of the above described upper limit or below. While a half width of the X-ray omega rocking curve of the specific crystal face reflects crystal qualities in the neighborhood of the crystal surface, those of the inclined crystal faces reflect crystal qualities in a deeper region of the crystal. The half widths of the X-ray omega rocking curves of the inclined crystal faces satisfying this range further improve the quality of the aluminum nitride single crystal layer 11 grown over the base substrate 10. The X-ray omega rocking curves of the inclined crystal faces preferably have a half width of no more than 50 arcsec, and especially preferably have a half width of no more than 30 arcsec. While a narrower half width is more preferable, the half width is preferably no less than 5 arcsec in view of industrial production of the base substrate 10.

In measurement of the X-ray omega rocking curves of the inclined crystal faces, since the means for monochromation of an X-ray source affects resolution of the measured half-widths, an X-ray source monochromated by at least being diffracted four times by the (220) face of a germanium single crystal is preferably used.

When a thick aluminum nitride single crystal layer is formed over the main face of the base substrate 10, the dislocation density is preferably no more than $10^6$ cm$^{-2}$ in the main face. In order to make the aluminum nitride single crystal layer 11 thicker, the dislocation density in the main face is more preferably no more than $10^5$ cm$^{-2}$, further preferably no more than $10^4$ cm$^{-2}$, and especially preferably no more than $10^3$ cm$^{-2}$. While a lower dislocation density is more preferable, the lower limit of the dislocation density in the main face is 10 cm$^{-2}$ in view of industrial production of the base substrate. In the present invention, a value of an etch pit density is substituted for that of a dislocation density. The etch pit density means a number average density per unit area measured by: etching an aluminum nitride single crystal substrate in a molten alkali hydroxides of sodium hydroxide and potassium hydroxide to form pits at dislocations; counting the number of the pits formed on the surface of the aluminum nitride single crystal substrate by observation by means of an optical microscope; and dividing the number of the counted pits by an observed area.

The shape of the base substrate 10 may be round, or quadrangular, or even indefinite, and the area thereof is preferably 100 to 10000 mm$^2$. The thickness of the base substrate 10 may be determined within such a range that the base substrate 10 does not break due to insufficient strength when the aluminum nitride single crystal layer is grown. Specifically, the thickness is preferably 50 to 2000 μm, and more preferably 100 to 1000 μm.

The main face of the base substrate 10 is not especially limited other than the above. The surface roughness (root mean square roughness) thereof is 0.05 to 0.5 nm, and an atomic step is preferably observed by observation by means of an atomic force microscope or a scanning probe microscope whose field is approximately 2 μm×2 μm. The surface roughness can be adjusted by CMP (chemomechanical polishing) as well as in the polishing step described in detail below. The surface roughness is measured after foreign substances and contaminants on the surface of the base substrate are removed by means of an atomic force microscope or a scanning prove microscope, to be obtained by observation of a field of 5 μm×5 μm. It is also possible to use a base substrate whose main face is embossed to have an island-like or striped pattern.

The radius of curvature of a surface of the main face of the base substrate 10 is not specifically limited either, and is preferably within the range of 0.1 to 10000 m. Because the base substrate is iteratively used as the renewed base substrate in the present invention, the radius of curvature of the surface of the main face of the base substrate 10 is preferably 2 to 10000 m, and more preferably 8 to 10000 m. When the main face of the base substrate 10 is a (001) face, a (110) face, or a (100) face, the radius of curvature of a crystal face that forms the main face of the base substrate 10, or of a crystal face parallel to the main face is not specifically limited, and is preferably within the range of 2 to 10000 m. Because the aluminum nitride single crystal layer is grown to have a thickness of no less than 500 μm in the present invention, a small radius of curvature of the crystal face that forms the main face of the base substrate 10, or of a crystal face parallel to the main face may lead to crack formation when the thick layer is grown. Therefore, the radius of curvature of the crystal face is preferably 5 to 10000 m, and further preferably 10 to 10000 m. In the present description, the "crystal face that forms the main face of the base substrate 10, or a crystal face parallel to the main face" is: a (002) face when the main face is a (001) face; a (110) face itself when the main face is a (110) face; and a (100) face itself when the main face is a (100) face. This is because, while a (110) face and a (100) face of aluminum nitride themselves are X-ray diffractive, not a (001) face thereof but a (002) face that is parallel to the (001) face is X-ray diffractive.

Using such a base substrate leads to improved crystal qualities of the aluminum nitride single crystal layer 11 grown over the base substrate 10, as well as improved crystal qualities of the aluminum nitride single crystal self-supporting substrate 11a obtained in the separation step good, and further, improved performance of light emitting devices and electronic devices that are manufactured using the aluminum nitride single crystal self-supporting substrate 11a.

The base substrate 10 may be grown by a sublimation method, and may be grown by HVPE. Of course, the effect of the present invention can be also obtained without any problem from a base substrate grown by a liquid-phase method. It is also possible to use a base substrate that is embossed to have an island-like or striped pattern in advance.

The properties of the base substrate as described above such as the properties of the main face, the offset angle, the half width of the X-ray omega rocking curve, the dislocation density, the size, the surface roughness, and the radius of curvature can be applied to the renewed base substrate 10b or 10c described in detail below as well.

(Growth Step)

The growth step is a step of growing the aluminum nitride single crystal layer 11 of no less than 500 μm in thickness over the base substrate 10.

Any of a sublimation method, a liquid-phase method, and vapor phase growth may be employed for a growing method of the aluminum nitride single crystal layer 11. In a case of a sublimation method, the aluminum source is vapor of sublimated or decomposed aluminum nitride, and the nitrogen source is vapor of sublimated or decomposed aluminum nitride, or nitrogen gas supplied to a growth apparatus. In a case of a liquid-phase method, the aluminum source and the nitrogen source are solution in which aluminum nitride is dissolved. In a case of vapor phase growth, examples of the aluminum source include aluminum halide gases such as aluminum chloride, aluminum iodide, and aluminum bromide, and organic aluminum gases such as trimethylaluminum, and triethylaluminum, and examples of the nitrogen source include ammonia gas and nitrogen gas.

(Preferred Growth Method; Growth of Aluminum Nitride Single Crystal Layer 11 by HVPE)

Among these growth methods, the effect of the producing method of the aluminum nitride single crystal of the present invention is significant when the aluminum nitride single crystal is grown by HVPE (hydride vapor phase epitaxy) among the other methods of vapor phase growth. HVPE is preferable for production of an aluminum nitride single crystal substrate for light emitting devices because the concentration of impurities that have a bad effect on a deep ultraviolet light transmissivity can be lowered although the growth rate is lower than a sublimation method. HVPE is also preferable for production of an aluminum nitride single crystal substrate for electronic devices because impurities can be reduced, which reduces the density of point defects such as aluminum vacancy which have a bad effect on electron mobility. HVPE makes crystal qualities and mass productivity well-balanced because the growth rate is higher than a liquid-phase method, which makes it possible to grow a single crystal of good crystallinity at a high deposition rate.

HVPE has advantages described above. When the aluminum nitride single crystal layer 11 is grown, though, high reactivity of an aluminum halide gas and ammonia easily causes a reaction in a gas phase in addition to the reaction on the base substrate 10, which leads to easy formation of particulate aluminum nitride. As a result, unintended fine particles may adhere to the aluminum nitride single crystal layer 11 grown over the base substrate 10. If the aluminum nitride single crystal layer 11 to which such fine particles adhere is separated, cut, and polished to make base substrates, an aluminum nitride single crystal grown over each base substrate is prone to have variance. The present invention makes it possible to reduce this variance, and thus can be preferably used when the aluminum nitride single crystal layer 11 is grown by HVPE.

Figure 3:
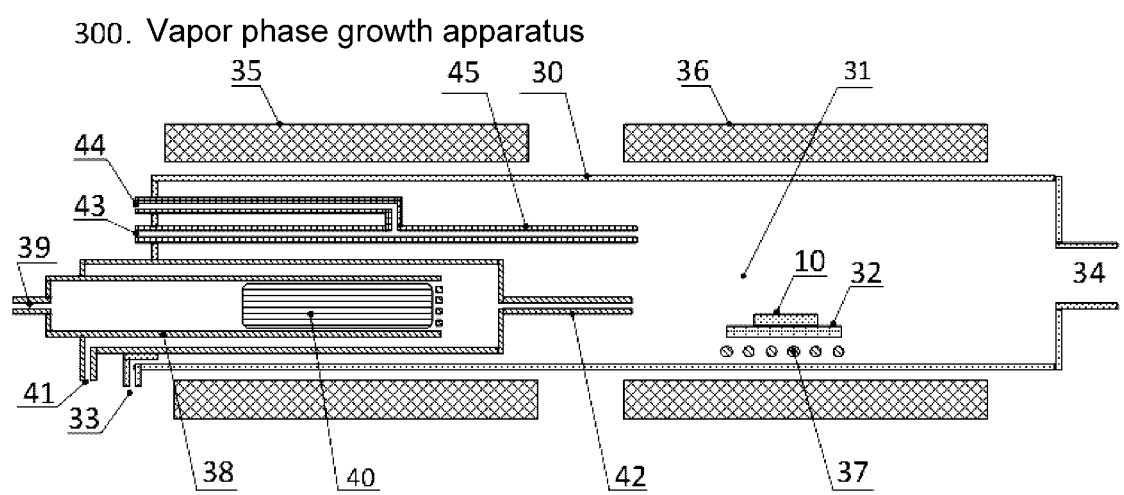
FIG. 3 is an explanatory cross-sectional view of one embodiment of a producing apparatus of an aluminum nitride single crystal which is preferably usable in the present invention.

FIG. 3 shows a schematic view of a vapor phase growth apparatus (HVPE apparatus) 300 used for HVPE. The aluminum nitride single crystal layer is grown by supplying an aluminum source gas and a nitrogen source gas into a reactor, and making these gasses react on the heated base substrate 10. Examples of the aluminum source gas used here include aluminum halide gases such as aluminum chloride gas, and mixed gases of organoaluminum gas and hydrogen halide gases. Preferred examples of the nitrogen source gas include ammonia gas. These raw material gasses are supplied together with a carrier gas such as hydrogen gas, nitrogen gas, argon gas, and helium gas. One gas may be individually used, or two or more gases may be used in combination, as a carrier gas. Further, the aluminum source gas and the nitrogen source gas may be supplied with an additional halogen-based gas such as a halogen gas and a hydrogen halide gas, so as to suppress formation of metal aluminum from a disproportionation reaction of the aluminum halide gas. In addition to the supply of these gases, growth conditions such as a shape of a nozzle that supplies the raw material gases onto the base substrate, a shape of the reactor into which the raw material gasses are supplied, the composition of the carrier gas, the supply of the carrier gas, the linear velocity of the gas flow in the reactor, a growth pressure (pressure in the reactor), and the heating temperature (growth temperature) of the base substrate are properly adjusted, so as to obtain good crystal qualities at a desired growth rate. Typical examples of the growth conditions include: aluminum source gas: 0.1 to 100 sccm; nitrogen source gas: 1 to 10000 sccm; additionally supplied halogen-based gas: 0.1 to 10000 sccm; total flow of carrier gas: 1000 to 100000 sccm; composition of carrier gas: nitrogen, hydrogen, argon, and helium (gas composition may be freely selected); linear velocity at nozzle outlet that supplies aluminum source gas: 50 to 500 sccm; linear velocity at nozzle outlet that supplies nitrogen source gas: 10 to 400 sccm; linear velocity of gas to make the entire atmosphere inside a reactor keep flowing: 5 to 200 sccm; growth pressure: 36 to 1000 Torr; and heating temperature (growth temperature) of base substrate: 1200 to 1800° C.

Various researches have been made on HVPE so as to obtain a single crystal of good crystallinity. In the present invention, such known researched methods can be used without any specific limitation. Among them, in the present invention, it is preferable to employ as a raw material gas an aluminum halide gas (comprising an aluminum trihalide gas as a major component) with a reduced content of an aluminum monohalide gas. An aluminum trihalide gas with a high content of an aluminum monohalide gas may lead to low crystal qualities. Therefore, it is preferable to take a measure to make an aluminum monohalide gas contained in the aluminum source gas as little as possible.

A condition such that formation of aluminum nitride fine particles in a gas phase is less prone to occur may be temporarily selected at the beginning of growth of the aluminum nitride single crystal layer 11 when a growth environment is unstable. The growth conditions at the beginning of growth can be freely selected among the examples of the typical conditions. Specifically, a growth stage of a short period for taking a measure such as limiting the supply of the raw materials, temporarily increasing the supply of the coexisting halogen-based gas, and fluctuating a pressure may be provided at the initial stage of growth on the base substrate, and after the growth environment stabilizes, the conditions may be changed for those for growing a thick layer. Growing the aluminum nitride single crystal layer 11 under these conditions so as to have the maximum film thickness of no more than 100 µm can further reduce variance of the quality of the aluminum nitride single crystal self-supporting substrate 11a. Of course, under the condition such that formation of aluminum nitride fine particles in a gas phase less occurs as described above, or under such a flow condition that adhering matters such as foreign substances are few as described above, the aluminum nitride single crystal layer (11 and 13) may be grown over the base substrate even under the same conditions as the initial stage of growth.

A method of embossing the base substrate to have an island-like or striped pattern in advance, to limit a portion of growth of the aluminum nitride single crystal layer at the initial stage of growth, may be also applied. In such a growth method, aluminum nitride single crystals independently grow from each protrusion on the surface of the base substrate to the right above or oblique above, and in due course aluminum nitride single crystals which have independently grown from adjacent protrusions contact with each other, and finally a thick film of a single aluminum nitride single crystal grows.

When the conductivity of the aluminum nitride single crystal layer 11 needs to be controlled, the aluminum nitride single crystal layer may be grown while an impurity that becomes a donor or an acceptor (such as compounds containing Si, Mg, S, etc.) are properly supplied.

In the present invention, the thickness of the aluminum nitride single crystal layer 11 grown in the growth step has to be no less than 500 µm. This thickness of less than 500 µm makes the aluminum nitride single crystal self-supporting substrate 11a obtained in the separation step thin. Thus, when the aluminum nitride single crystal self-supporting substrate 11a is processed to be a wafer for manufacturing devices by peripheral milling or polishing, the aluminum nitride single crystal self-supporting substrate 11a is easy to be damaged due to insufficient strength, which is not preferable. The upper limit of the thickness of the aluminum nitride single crystal layer 11 in the growth step is not specifically limited, and in view of industrial production, is 2000 µm. The growth step and the polishing step take a lot of time in a case where the aluminum nitride single crystal layer 11 to be grown is excessively thick. Thus, in view of industrial production, the thickness of the aluminum nitride single crystal layer 11 grown in the growth step is preferably 600 to 1500 µm, and further preferably 800 to 1200 µm. Via the growth step, the layered body having the base substrate 10 and the aluminum nitride single crystal layer 11 grown over the base substrate 10 is obtained.

The conditions in the growth step may be also applied when the renewed base substrate 10b or 10c is used as a base substrate, to grow the new aluminum nitride single crystal layer 13 over the surface (over the main face) of the renewed base substrate 10b or 10c.

(Separation Step)

In the present invention, the separation step is a step of cutting the aluminum nitride single crystal layer 11 of the layered body which is obtained in the growth step, to separate the layered body into a base substrate (cut base substrate 10a) including the thin film 11b that is at least part of the aluminum nitride single crystal layer 11 layered thereon, and the other part of the aluminum nitride single crystal layer 11a. A known way (such as using a wire saw) may be employed for cutting in the separation step.

Cutting in the separation step is carried out parallel to the grown surface of the base substrate 10. When a wire saw is used in the separation step, a wire saw of either fixed abrasive grains or free abrasive grains may be used. The tension of the wire is preferably properly adjusted so that the thickness of a cutting margin becomes thin, for example, approximately 100 to 300 µm.

The cutting speed of the wire saw is properly adjusted so that a residual distortion layer (damaged layer) remaining on the cut surface of the aluminum nitride single crystal layer becomes thin, and a condition of a relatively low speed is preferable. The cutting speed is preferably within the range of 0.5 mm/h to 20 mm/h. The cutting direction to the crystal face of the aluminum nitride single crystal may be freely selected.

Wire in cutting may be moved such that it swings. The wire may be successively or intermittently moved in the cutting direction. Swinging movement of the wire in cutting is properly controlled in order to prevent cracks from being formed due to heat generated by friction in cutting.

In order to suppress crack formation accompanying chipping of the periphery of the base substrate in cutting, one may cover whole or part of the layered body of the base substrate 10 and the aluminum nitride single crystal layer 11 with resin, cement, or the like prior to the separation step, and thereafter perform cutting. Examples of resin that can be used in this case include common epoxy resins, phenolic resins and waxes. After the layered body is covered with resin, the resin is cured by a common means such as curing by self-drying, thermosetting, and photo-setting, and thereafter cutting is carried out. Examples of cement that can be used here include common industrial Portland cement, aluminon cement, and gypsum.

In cutting in the cutting step, the layered body itself may be revolved. The speed of revolution of the layered body is preferably within the range of 1 rpm to 10 rpm.

The thickness of the residual aluminum nitride single crystal thin film 11b on the cut base substrate 10a after separation is not specifically limited, and is preferably 5 µm to 300 µm. This thickness within this range makes it possible to remove the distortion layer via the renewing polishing step described later.

The optimal thickness of the aluminum nitride single crystal thin film 11b is different even within the above range, between the case where a polished substrate having the aluminum nitride single crystal thin film 11c, which is polished (renewed base substrate 10c), is made and the case where a polished substrate not having the aluminum nitride single crystal thin film 11b ((renewed base substrate 10b); substrate on the surface of which the original base substrate 10 is exposed) is made, in the polishing step described in detail later. Next, a proper thickness of the aluminum nitride single crystal thin film 11b when these renewed base substrates are made will be described.

(Separation Step: When Polished Substrate not Having Aluminum Nitride Single Crystal Thin Film 11b is Made)

When the polished substrate (renewed base substrate 10b) not having the aluminum nitride single crystal thin film 11b is made from the cut base substrate 10a, a state where the distortion layer is limited to be inside the aluminum nitride single crystal thin film 11b is the most preferable. Thus, in this case, the thickness of the aluminum nitride single crystal thin film 11b in the separation step is preferably 1 to 300 µm. This thickness within this range can shorten the polishing time, and can suppress propagation of the damaged layer to the original base substrate 10. In view of increasing the number of iterative use of the original base substrate 10, the thickness of the aluminum nitride single crystal thin film 11b in the separation step when the polished substrate (renewed base substrate 10b) not having the aluminum nitride single crystal thin film 11b is made is more preferably 20 to 200 µm, and further preferably 50 to 150 µm.

(Separation Step: When Polished Substrate Having Aluminum Nitride Single Crystal Thin Film 11c, which is Polished, is Made)

When the polished substrate (renewed base substrate 10c) having the aluminum nitride single crystal thin film 11c is made from the cut base substrate 10a, the distortion layer on the surface of the aluminum nitride single crystal thin film 11b is preferably removed by polishing. Therefore, in this case, the thickness of the aluminum nitride single crystal thin film 11b in the separation step is preferably 20 to 300 µm. This thickness within this range can shorten the polishing time, and makes it possible for the damaged layer not to remain in a residual layer of the aluminum nitride thin film 11b. In view of increasing the number of iterative use of the renewed base substrate, and of reliably removing the damaged layer, the thickness of the aluminum nitride single crystal thin film 11b in the separation step when the polished substrate (renewed base substrate 10c) having the aluminum nitride single crystal thin film 11c is made is more preferably 50 to 250 µm, and further preferably 100 to 200 µm.

A peripheral milling step may be introduced before or after the layered body is cut, for the purposes of removing polycrystals formed on the periphery of the base substrate 10/the aluminum nitride single crystal layer 11, and of shaping the periphery to be round. In addition, for example, known substrate processing such as chamfering for exposing the crystal face or the inclined face on an end face of the periphery of the substrate, or for introducing an orientation flat, may be carried out. When the offset angle of the main face of the renewed base substrate 10b or 10c is changed, for example, an angle of the wire saw in cutting to the crystal face corresponding to the main face may be properly adjusted. Flat face exposure polishing or chemomechanical polishing (CMP) may be carried out before cutting because there is often a case where an embossed structure appears on the surface of the aluminum nitride single crystal layer 11 just after growth.

(Renewing Polishing Step)

The renewing polishing step is a step of polishing the surface of the cut base substrate 10a on the thin film 11b side of the cut base substrate 10a on which the thin film 11b is layered. Via the renewing polishing step, the renewed base substrate 10b or 10c is made.

The aluminum nitride single crystal layer 11 grown over the base substrate 10 sometimes has a quality with local deterioration due to deposits and adhering matters accidentally formed in the growth process, and impurities accompanying deterioration of members in the crystal growth apparatus etc. Thus, there is a high probability that a locally deteriorating portion of the aluminum nitride single crystal thin film 11b remains when the renewed base substrate 10c is produced by renewing polishing as the aluminum nitride single crystal thin film 11b is left thick. In contrast, when the renewed base substrate 10b on the surface of which the base substrate 10 is exposed is made from the cut base substrate 10a, the thickness of the renewed base substrate 10b is becoming thinner as more iteratively used as a base substrate, which may deteriorate operability. Thus, in view of iteratively using one base substrate for a long time, the renewed base substrate 10c having the polished thin film is preferably made. When an aluminum nitride single crystal with more stable qualities is to be grown, the renewed base substrate 10b on the surface of which the base substrate 10 is exposed is preferably made. Next, these renewed base substrates 10b and 10c will be described.

(Renewing Polishing Step: Renewed Base Substrate 10b on Surface of which Base Substrate 10 is Exposed)

In the following repetition step, when the new aluminum nitride single crystal layer 13 is grown over the renewed base substrate where local deterioration remains, a locally deteriorating portion is easy to be formed in the new aluminum nitride single crystal layer 13 due to the residual locally deteriorating portion. Since a locally deteriorating portion is accidentally formed, the crystal qualities of the new aluminum nitride single crystal layer 13 is prone to have variance.

Thus, in order to grow the new aluminum nitride single crystal layer 13 with a more stable quality, in the renewing polishing step, the cut base substrate 10a obtained in the separation step is preferably subjected to renewing polishing until the base substrate is exposed on all over the surface thereof, to produce the renewed base substrate 10b. Next, in the repetition step, the new aluminum nitride single crystal layer 13 is grown over the renewed base substrate 10b. Whereby, even if a deteriorating portion is accidentally formed when the aluminum nitride single crystal layer 11 is grown over the base substrate 10, the deteriorating portion can be removed by the renewing polishing step. As a result, in the repetition step, the quality of the new aluminum nitride single crystal layer 13 grown over the renewed base substrate 10b becomes more stable. Further, even repeating the repetition step a plurality of times to iteratively use the base substrate results in obtainment of the aluminum nitride single crystal layers (11 and 13) with a stable quality.

In the renewing polishing step in the embodiment of producing the renewed base substrate 10b on the surface of which the base substrate 10 is exposed, the aluminum nitride single crystal thin film 11b is all removed. The distortion layer is formed on the surface of the cut base substrate 10a in cutting. When the aluminum nitride single crystal thin film 11b is thin, distortion in cutting may propagate to the base substrate 10. In such a case, preferably, the aluminum nitride thin film 11b is removed, and polishing is carried out until the surface of the original base substrate 10 is exposed, to make the renewed base substrate 10b. When the distortion layer remains in the renewed base substrate 10b, in the next repetition step, the crystal qualities of the new aluminum nitride single crystal layer 13 grown over the renewed base substrate 10b deteriorate, or a residual stress causes cracks in the new aluminum nitride single crystal layer 13. Residual distortion leads to deformation (curvature) of the substrate due to Twyman effect, which results in necessity of further care in handling the substrate. The presence or not of the distortion layer in the renewed base substrate 10b can be confirmed by the same manner as is described concerning the base substrate 10 in the preparation step. That is, preferably, the main face of the renewed base substrate 10b (surface where the new aluminum nitride single crystal layer 13 is grown) is a (001) face, a (110) face, or a (100) face; and an X-ray omega rocking curve of a specific crystal face has a half width of no more than 200 arcsec, wherein the X-ray omega rocking curve is measured under a condition that an incident angle between an incident X-ray and the main face is no more than 4°. Here, when the main face is a (001) face, the specific crystal face is a (103) face; when the main face is a (110) face, the specific crystal face is a (114) face; and when the main face is a (100) face, the specific crystal face is a (106) face. The incident angle between an incident X-ray and the main face is more preferably no more than 2°. In view of current measurement techniques, the lower limit of the incident angle between an incident X-ray and the main face is 0.1°. The X-ray omega rocking curve of the specific crystal face more preferably has a half width of no more than 100 arcsec, and further preferably has a half width of no more than 60 arcsec. The half width is preferably no less than 10 arcsec. In measurement of the X-ray omega rocking curve of the specific crystal face, an X-ray source monochromated by being diffracted twice by the (220) face of a germanium single crystal is preferably used.

The thickness of the renewed base substrate 10b in the renewing polishing step is preferably thinner than that of the original base substrate 10 by 0.1 µm to 300 µm. In view of stability of the quality of the new aluminum nitride single crystal layer 13 grown over the renewed base substrate 10b, and increasing the number of iterative use of the original base substrate 10, the thickness of the renewed base substrate 10b is more preferably thinner than that of the original base substrate 10 by 5 µm to 100 µm, and further preferably thinner than that of the original base substrate 10 by 10 µm to 50 µm.

(Renewing Polishing Step: Renewed Base Substrate 10c Having Polished Thin Film 11c)

In the following repetition step, when the new aluminum nitride single crystal layer 13 is grown over the renewed base substrate 10c having the polished thin film 11c, the thickness of the aluminum nitride single crystal thin film 11b layered on the renewed base substrate 10c is preferably within a predetermined range in order to suppress variance in the quality of the new aluminum nitride single crystal layer 13. As described above, there is a probability that a locally deteriorating portion is accidentally formed in the aluminum nitride single crystal layer 11 grown over the base substrate 10. However, the thickness of the aluminum nitride single crystal thin film 11b within a predetermined range increases the probability of excluding the locally deteriorating portion. Further, according to the embodiment of making the renewed base substrate 10c having the polished thin film 11c, the original base substrate 10 can keep its initial thickness even after the renewing polishing step, which makes it possible to increase the number of iterative use of the base substrate 10.

The thickness of the renewed base substrate 10c having the polished thin film 11c in the renewing polishing step is preferably thicker than that of the original base substrate 10 by 0.1 µm to 100 µm. That is, the thickness of the aluminum nitride single crystal thin film 11c after renewing polishing is preferably 0.1 µm to 100 µm. In view of stability of the quality of the new aluminum nitride single crystal layer 13 grown over the renewed base substrate 10c, and increasing the number of iterative use of the original base substrate 10, the thickness of the renewed base substrate 10c is more preferably thicker than that of the original base substrate 10 by 2 µm to 50 µm, and further preferably thicker than that of the original base substrate 10 by 5 µm to 30 µm. That is, the thickness of the aluminum nitride single crystal thin film 11c after renewing polishing is more preferably 2 µm to 50 µm, and further preferably 5 µm to 30 µm.

In order to remove the distortion layer in the renewing polishing step, polishing is carried out preferably by more than 10 µm, more preferably by no less than 30 µm, and further preferably by no less than 100 µm, from the surface of the cut base substrate 10a. As the removal by polishing is more, the distortion layer can be removed more. However, a more removal by polishing leads to higher industrial costs.

Thus, the removal by polishing is preferably no more than 600 µm, more preferably no more than 200 µm, and further preferably no more than 100 µm. The presence or not of the distortion layer can be confirmed in the same manner as is described concerning the base substrate 10 in the preparation step. That is, preferably, the main face of the renewed base substrate 10c (surface where the new aluminum nitride single crystal layer 13 is grown) is a (001) face, a (110) face, or a (100) face; and an X-ray omega rocking curve of a specific crystal face has a half width of no more than 200 arcsec, wherein the X-ray omega rocking curve is measured under a condition that an incident angle between an incident X-ray and the main face is no more than 4°. Here, when the main face is a (001) face, the specific crystal face is a (103) face; when the main face is a (110) face, the specific crystal face is a (114) face; and when the main face is a (100) face, the specific crystal face is a (106) face. The incident angle between an incident X-ray and the main face is more preferably no more than 2°. In view of current measurement techniques, the lower limit of the incident angle between an incident X-ray and the main face is 0.1°. The X-ray omega rocking curve of the specific crystal face more preferably has a half width of no more than 100 arcsec, and further preferably has a half width of no more than 80 arcsec. The half width is preferably no less than 10 arcsec. In measurement of the X-ray omega rocking curve of the specific crystal face, an X-ray source monochromated by being diffracted twice by the (220) face of a germanium single crystal is preferably used.

(Renewing Polishing Step: Conditions of Polishing)

Known conditions can be employed for conditions for polishing the cut base substrate 10a in order to make the renewed base substrate 10b on the surface of which the base substrate 10 is exposed, and the renewed base substrate 10c having the polished thin film 11c. Conditions same as these polishing conditions can be employed when the other part of the aluminum nitride single crystal 11a is polished.

The renewing polishing step is preferably completed by chemomechanical polishing (CMP) in order to remove the distortion layer in cutting. A known method can be employed for CMP. Examples of an abrasive that can be used here include abrasives containing materials such as silica, alumina, ceria, silicon carbide, boron nitride, and diamond. The properties of the abrasive may be alkaline, neutral, or acidic. Since alkali resistance of a nitrogen-polar face (−c face) of aluminum nitride is low, a weakly alkaline, neutral or acidic abrasive, specifically an abrasive of no more than 9 in pH is more preferably used than a strong alkaline abrasive. Of course, if a protection film is formed on the nitrogen-polar face, a strong alkaline abrasive can be used as well without any problem. An additive such as an oxidizing agent may be incorporated into the abrasive in order to improve the polishing rate. A commercially available polishing pad can be used, and material and hardness thereof are not specifically restricted.

Polishing in the renewing polishing step may be carried out by, for example, CMP from the beginning to the end. For example, when the aluminum nitride thin film 11b layered on the cut base substrate 10a is thick, CMP may be carried out after the thickness is adjusted to approximately a desired thickness by a means having a high polishing rate such as mirror finish lapping in advance.

The renewed base substrate 10b or 10c obtained in the renewing polishing step is the same as the base substrate 10 except that the thickness of the substrate becomes thin (in the case of the base substrate 10b on the surface of which the base substrate 10 is exposed), or except for having the polished thin film 11c (in the case of the renewed base substrate 10c). Thus, the properties of the renewed base substrate 10b are almost the same as those of the base substrate 10. Therefore, the half width of the X-ray omega rocking curve and the dislocation density of the renewed base substrate 10b or 10c can be equivalent to those of the original base substrate 10. When the offset angle of the surface of the substrate differs from a desired angle in the separation step, a polishing step for adjusting the offset angle of the main face of the renewed base substrate 10b or 10c to a desired offset angle may be further carried out.

(Repetition Step)

The repetition step is a step of growing the new aluminum nitride single crystal layer 13 over the polished surface of the renewed base substrate (10b or 10c) consisting of the aluminum nitride single crystal obtained in the renewing polishing step. The repetition step may preferably include carrying out the preparation step, the growth step, the separation step, and the renewing polishing step using the renewed base substrate as a new base substrate. The repetition step may be iteratively carried out.

In the repetition step, a method of growing the new aluminum nitride single crystal layer 13 over the renewed base substrate (10b or 10c) is not specifically restricted, and the above described method in relation to the growth step can be employed. According to the producing method of the aluminum nitride single crystal substrate of the present invention, iteratively using the base substrate 10 (renewed base substrate 10b or 10c) makes it possible to produce the layered body having the aluminum nitride single crystal layer (11 and 13) with a stable quality, which further makes it possible to obtain the aluminum nitride single crystal self-supporting substrate 11a from the layered body by cutting, with stable qualities.

(Utilizing Aluminum Nitride Single Crystal Layer 11)

In the separation step, the aluminum nitride single crystal layer 11 separated from the base substrate 10 can be used as the aluminum nitride single crystal self-supporting substrate 11a. The separated aluminum nitride single crystal layer 11a can be used for formation of electronic devices and layers of light emitting devices after at least one surface thereof is finished in an epi-ready state (surface flat enough to form a new layer by vapor phase growth) after known process such as milling and polishing. A known method such as metal organic chemical vapor deposition (MOCVD), molecular beam epitaxy (MBE), and hydride vapor phase epitaxy (HVPE) can be employed when forming electronic devices and layers of light emitting devices. If the aluminum nitride single crystal self-supporting substrate 11a finished in an epi-ready state has the same properties as the original base substrate 10, one may use the aluminum nitride single crystal self-supporting substrate 11a as a new base substrate, to further grow an aluminum nitride single crystal layer over the new base substrate as well. It is noted that iterative use of the aluminum nitride single crystal self-supporting substrate 11a newly obtained in every separation step as a new base substrate leads to a high probability of obtaining the aluminum nitride single crystal self-supporting substrate 11a whose properties are different from those of the original base substrate. Thus, the aluminum nitride single crystal self-supporting substrate 11a newly obtained in every separation step is not preferably used as a new base substrate.

EXAMPLES

Hereinafter the present invention will be described in detail with reference to Examples. The present invention is not limited to the following Examples.

Example 1

In this Example, one base substrate was iteratively used to obtain aluminum nitride single crystal layers (11 and 13), employing the embodiment of making the renewed base substrate 10b, on the surface of which the base substrate 10 is exposed.

(Preparation Step)

The following was used as the base substrate 10: aluminum nitride single crystal substrate produced by sublimation method; diameter: 25 mm; thickness: 500 μm; crystal face direction of main face: (001) face, offset angle of main face in m-axis direction: 0.3°; offset angle of main face in a-axis direction: 0.05°; radius of curvature of surface of substrate: 12 m; surface roughness: 0.12 nm; dislocation density (etch pit density): $2 \times 10^4$ cm$^{-2}$; half width of X-ray omega rocking curve of (002) face (inclined crystal face): 12 arcsec; half width of X-ray omega rocking curve of (101) face (inclined crystal face): 11 arcsec; half width of X-ray omega rocking curve of (103) face (specific crystal face): 46 arcsec; and radius of curvature of (002) crystal face parallel to main face: 12 m.

The entire surface of the substrate was measured by means of a white-light interferometric microscope (NewView 7300 manufactured by Zygo Corporation) with an object lens with a magnifying power of 10 to obtain a microscope image; an area by 1 mm from the periphery was excluded from this obtained microscope image, to obtain a surface figure profile of 23 mm in diameter; and the radius of curvature of the surface of the substrate was obtained from this surface figure profile. The X-ray omega rocking curves of the (002) face (inclined crystal face) and the (101) face (inclined crystal face) were measured by means of a thin film X-ray diffractometer (X'Pert MRD manufactured by Malvern Panalytical) in combination with: a Ge(220) four-crystal monochromator module equipped with a ½° slit; and a Xe proportional counter. The X-ray omega rocking curve of the (103) face (specific crystal face) was measured by means of a thin film X-ray diffractometer (X'Pert MRD manufactured by Malvern Panalytical) in combination with: a Ge(220) double crystal monochromator module (hybrid module) equipped with a ⅛° slit; and a Xe proportional counter. By means of a thin film X-ray diffractometer (X'Pert MRD manufactured by Malvern Panalytical) in combination with: a Ge(220) four-crystal monochromator module equipped with a ½° slit; and a Xe proportional counter, the radius of curvature of the (002) crystal face (crystal face parallel to the main face) was measured by the following procedure: a stage was positioned at ±8 mm away from the center of the substrate wherein the center was regarded as a position of 0 mm; an X-ray omega rocking curve was measured; and the radius of curvature of the (002) crystal face (crystal face parallel to the main face) was measured from the positional relationship between the peak position of the X-ray omega rocking curve and the optical system of X-ray irradiation. The dislocation density was measured by: weighing potassium hydroxide and sodium hydroxide (weight ratio: 1:1); melting the weighed potassium hydroxide and sodium hydroxide in a platinum crucible (temperature in the crucible: 450° C.) to make an alkaline melt; etching a growth surface using the alkaline melt for 5 minutes; thereafter observing the surface of the substrate by means of a differential interference contrast microscope in 5 fields at a magnification of 500×; counting the number of formed pits; and dividing the number of the counted pits by an area of the observed fields.

(Growth Step)

Using a crystal growth apparatus (HVPE apparatus) shown in FIG. 3, the aluminum nitride single crystal layer 11 was grown over the base substrate 10 prepared in the preparation step. The base substrate 10 was disposed on a susceptor 32. Next, 9000 sccm of a hydrogen-nitrogen mixed carrier gas (mixture ratio:hydrogen:nitrogen=7:3) was made to flow from a pushing carrier gas inlet 33 as gas to make the entire atmosphere inside a reaction pipe keep flowing. The pressure in a reactor 30 was kept at 0.99 atm during growth.

Ammonia gas (20 sccm) and hydrogen carrier gas (160 sccm) were supplied from a nitrogen source gas inlet 43, and hydrogen chloride gas (20 sccm) was supplied from an additional halogen-based gas supply nozzle 44, to supply 200 sccm of a mixed gas in total from a nitrogen source gas supply nozzle 45 to a growth part reaction zone 31 where the base substrate 10 was disposed. At this time, the temperature of the nitrogen source gas supply nozzle 45 was adjusted to be 500° C. so that ammonium chloride that was a reaction product of ammonia gas and hydrogen chloride gas did not deposit. In addition, nitrogen gas (1500 sccm) was supplied from a barrier gas nozzle (not shown; a nozzle arranged so that a barrier gas can be supplied from a position between the nitrogen source gas supply nozzle 45 and an aluminum halide gas supply nozzle 42).

The base substrate 10 was heated to 1550° C. under these gas supply conditions. Thereafter, hydrogen chloride gas (114 sccm) was supplied from an additional halogen-based gas supply pipe 41, and a hydrogen-nitrogen mixed carrier gas (1686 sccm) was supplied from a raw material-generating halogen-based gas-introducing pipe 39, to supply 1800 sccm of a mixed gas in total from the aluminum halide gas supply nozzle 42.

Twenty seconds after beginning supplying hydrogen chloride gas from the additional halogen-based gas supply nozzle 41, 18 sccm of the hydrogen-nitrogen mixed carrier gas supplied from the raw material-generating halogen-based gas-introducing pipe 39 was switched to hydrogen chloride gas, to make it react with an aluminum raw material that was heated at 400° C. in advance by a raw material part outside heating means 35, to form aluminum chloride gas. The formed aluminum chloride gas was supplied from the aluminum halide gas supply nozzle 42 onto the base substrate 10, to start crystal growth.

At the gas flows and the temperature of the base substrate of these conditions, 860 μm of the aluminum nitride single crystal layer 11 was grown over the base substrate 10. After the aluminum nitride single crystal layer 11 was grown, the supply of aluminum chloride gas, ammonia gas, and hydrogen chloride gas was stopped, and the substrate was cooled to room temperature. Evaluation results of the obtained aluminum nitride single crystal layer 11 were: half width of the X-ray omega rocking curve of the (002) face (inclined crystal face): 13 arcsec, half width of the X-ray omega rocking curve of the (101) face (inclined crystal face): 12 arcsec, and half width of the X-ray omega rocking curve of the (103) face (specific crystal face): 54 arcsec.

(Separation Step)

A layered body having the grown aluminum nitride single crystal layer 11 was separated into a cut base substrate 10a and an aluminum nitride single crystal layer 11a, the cut base substrate 10a including the base substrate 10 and the thin film 11b layered thereon, the thin film 11b being part of the aluminum nitride single crystal layer 11, and the aluminum nitride single crystal layer 11a being another part of the aluminum nitride single crystal layer 11, by means of a wire saw using free abrasive grains, so that a cut face was parallel to the surface of the base substrate. The cutting margin in cutting was 280 μm. The thickness of the aluminum nitride single crystal self-supporting substrate 11a was 500 μm. The thickness of the residual film of the aluminum nitride single crystal layer 11b which was layered on the cut base substrate 10a was 80 μm.

(Renewing Polishing Step)

Since a saw mark (wavy trace) was found on the surface on a growth layer side of the cut base substrate 10a after cutting, the saw mark was removed to have a flat face exposed, and further a distortion layer was removed by CMP. The renewed base substrate 10b obtained by CMP had a thickness of 498 μm, and did not comprise the residual film of the aluminum nitride single crystal layer 11b.

Evaluation results of the renewed base substrate 10b were almost the same as those of the original base substrate 10: the crystal face direction of the main face was a (001) face, the offset angle of the main face in a m-axis direction was 0.35°, the offset angle of the main face in an a-axis direction was 0.15°, the radius of curvature of the surface of the substrate was 10 m, the surface roughness was 0.11 nm, the dislocation density (etch pit density) was $2 \times 10^4$ cm$^{-2}$, the X-ray omega rocking curve of a (002) face (inclined crystal face) had a half width of 12 arcsec, the X-ray omega rocking curve of a (101) face (inclined crystal face) had a half width of 11 arcsec, the X-ray omega rocking curve of a (103) face (specific crystal face) had a half width of 48 arcsec, and the radius of curvature of the (002) crystal face parallel to the main face was 12 m.

(Repetition Step)

On the renewed base substrate 10b, 1210 μm of the new aluminum nitride single crystal layer 13 was grown under the same raw material supply conditions as were employed in the growth step except that the growth time was changed. The obtained new aluminum nitride single crystal layer 13 was evaluated to have almost the same quality as the aluminum nitride single crystal layer 11 that was grown over the original base substrate 10: the X-ray omega rocking curve of a (002) face (inclined crystal face) had a half width of 12 arcsec, the X-ray omega rocking curve of a (101) face (inclined crystal face) had a half width of 11 arcsec, and the X-ray omega rocking curve of a (103) face (specific crystal face) had a half width of 53 arcsec.

Thereafter, the separation step, the renewing polishing step, and the repetition step were similarly carried out to iteratively use the base substrate 10, to grow the new aluminum nitride single crystal layer 13. The results thereof are summarized in Table 1. While values of the thickness of the new aluminum nitride single crystal layer 13 (only the growth time was changed), and the thickness of the aluminum nitride single crystal thin film 11b (only the thickness of the residual layer after cutting was changed, but the other conditions were the same) were different in every cycle, a plurality of the new aluminum nitride single crystal layer 13 with a stable quality were obtained, and a plurality of the aluminum nitride single crystal self-supporting substrates 11a with qualities good enough to be used for devices were able to be supplied from one base substrate. Improved qualities and reduced variance were confirmed by values and variance of the half widths of the X-ray omega rocking curves (of (002) face (inclined crystal face), (101) face (inclined crystal face), and (103) face (specific crystal face)) of the aluminum nitride single crystal layer 11 and the new aluminum nitride single crystal layer 13.

In this Example, since renewing polishing was carried out until the surface of the original base substrate 10 was exposed, the thickness of the renewed base substrate 10b was reduced every cycle. However, the evaluation results of every renewed base substrate 10b were almost the same as those of the original base substrate, and it was apparent that the renewed base substrate 10b was able to sufficiently function as a seed crystal.

Example 2

In this Example, one base substrate was iteratively used to grow thick aluminum nitride single crystal layers (11 and 13), employing the embodiment of making the renewed base substrate 10c having the polished aluminum nitride single crystal thin film 11c.

(Preparation Step and Growth Step)

An aluminum nitride single crystal substrate produced by a sublimation method same as in Example 1 was used as the base substrate 10. On this base substrate 10, 880 µm of the aluminum nitride single crystal layer 11 was grown in the same manner as in the growth step in Example 1. Evaluation results of the obtained thick aluminum nitride single crystal layer 11 were: half width of the X-ray omega rocking curve of a (002) face (inclined crystal face): 18 arcsec, half width of the X-ray omega rocking curve of a (101) face (inclined crystal face): 14 arcsec, and half width of the X-ray omega rocking curve of a (103) face (specific crystal face): 60 arcsec.

(Separation Step)

A layered body having the grown thick aluminum nitride single crystal layer 11 was separated into a cut base substrate 10a and an aluminum nitride single crystal layer 11a, the cut base substrate 10a including the base substrate 10 and the thin film 11b layered thereon, the thin film 11b being part of the aluminum nitride single crystal layer 11, and the aluminum nitride single crystal layer 11a being another part of the aluminum nitride single crystal layer 11, in the same manner as in the separation step in Example 1. The cutting margin in cutting was 280 µm. The thickness of the aluminum nitride single crystal self-supporting substrate 11a was 510 µm. The thickness of the residual film of the aluminum nitride single crystal layer 11b which was layered on the cut base substrate 10a was 90 µm.

(Renewing Polishing Step)

Since a saw mark was found on the surface on a growth layer side of the cut base substrate 10a after cutting, the saw mark was removed to have a flat face exposed, and further a distortion layer was removed by CMP. The renewed base substrate 10c obtained by CMP had a thickness of 504 µm, and comprised 4 µm of the residual film of the aluminum nitride single crystal layer 11c remaining. Evaluation results of this renewed base substrate 10c were almost the same as those of the original base substrate 10: the crystal face direction of the main face was a (001) face, the offset angle of the main face in a m-axis direction was 0.29°, the offset angle of the main face in an a-axis direction was 0.04°, the radius of curvature of the surface of the substrate was 11 m, the surface roughness was 0.13 nm, the dislocation density (etch pit density) was $5 \times 10^4$ cm$^{-2}$, the X-ray omega rocking curve of a (002) face (inclined crystal face) had a half width of 19 arcsec, the X-ray omega rocking curve of a (101) face (inclined crystal face) had a half width of 14 arcsec, the X-ray omega rocking curve of a (103) face (specific crystal face) had a half width of 63 arcsec, and the radius of curvature of the (002) crystal face parallel to the main face was 12 m.

(Repetition Step)

On the renewed base substrate 10c, 1170 µm of the new aluminum nitride single crystal layer 13 was grown under the same raw material supply conditions as were employed in the growth step except that the growth time was changed. When the obtained new aluminum nitride single crystal layer 13 was evaluated, the X-ray omega rocking curve of a (002) face (inclined crystal face) was had a half width of 20 arcsec, the X-ray omega rocking curve of a (101) face (inclined crystal face) had a half width of 15 arcsec, and the X-ray omega rocking curve of a (103) face (specific crystal face) had a half width of 66 arcsec. While slightly a little deterioration in values compared with the thick aluminum nitride single crystal layer 11 grown over the original the base substrate 10 was observed, the new aluminum nitride single crystal layer 13 had a quality good enough for use for devices.

Thereafter, the separation step, the renewing polishing step, and the repetition step were similarly carried out to iteratively use the base substrate 10, to grow the new aluminum nitride single crystal layer 13. The results thereof are summarized in Table 1. While values of the thickness of the new aluminum nitride single crystal layer 13 (only the growth time was changed), the thickness of the aluminum nitride single crystal thin film 11b (only the thickness of the residual film after cutting were changed, but the other conditions were the same), and the thickness of the polished aluminum nitride single crystal thin film 11c (this changed because the thickness of the aluminum nitride single crystal thin film 11b changed. The polishing conditions and the polishing amount were the same) were different in every cycle, no significant deterioration in crystal qualities was observed, and a plurality of the new aluminum nitride single crystal layer 13 with good qualities were obtained. Improved qualities and reduced variance were confirmed by values and variance of the half widths of the X-ray omega rocking curves (of (002) face (inclined crystal face), (101) face (inclined crystal face), and (103) face (specific crystal face)) of the aluminum nitride single crystal layer 11 and the new aluminum nitride single crystal layer 13.

In this Example, since renewing polishing was carried out so that the aluminum nitride single crystal thin film 11c remained, so as not to expose the surface of the original base substrate 10, the thickness of the renewed base substrate 10c was maintained even after the cycle of iterative use, which made it possible to supply a plurality of the aluminum nitride single crystal self-supporting substrates 11a with qualities good enough to be used for devices from one base substrate.

Comparative Example

Figure 4:
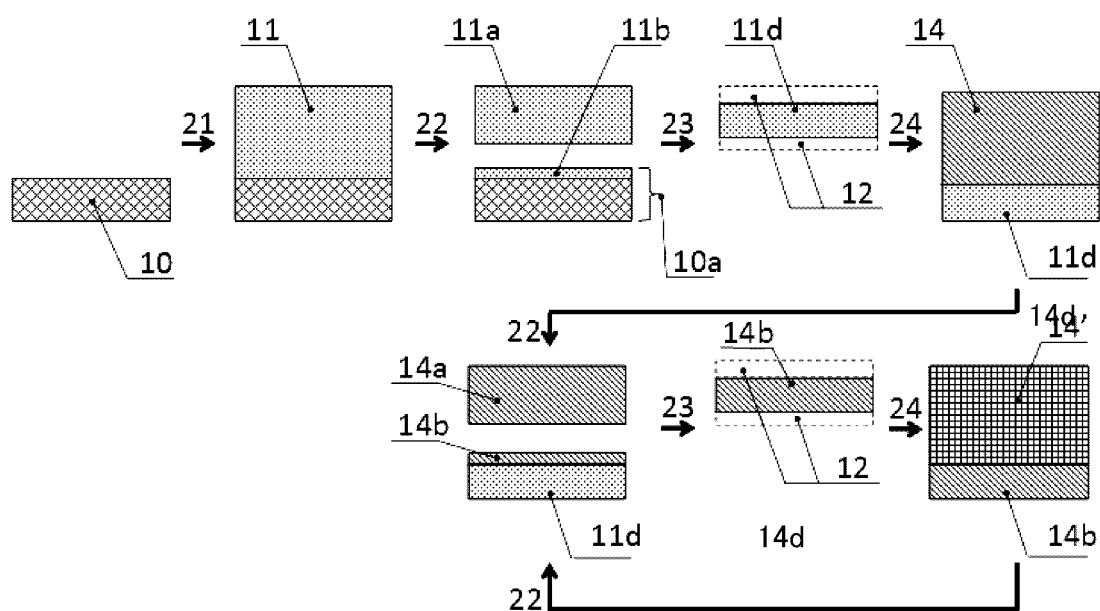
FIG. 4 explanatorily shows steps in a producing method according to Comparative Example.

In this Comparative Example, using the aluminum nitride single crystal self-supporting substrate 11a obtained from the aluminum nitride single crystal layer 11 (new aluminum nitride single crystal layer 13) in every separation step as a new base substrate, the qualities and variance in qualities of the grown aluminum nitride single crystal layers 11 and 13 were confirmed. FIG. 4 explanatorily shows steps in this Comparative Example.

(Growth Step)

An aluminum nitride single crystal substrate produced by a sublimation method same as in Example 1 was used as the base substrate 10. On this base substrate 10, 960 µm of the aluminum nitride single crystal layer 11 was grown in the same manner as in the growth step in Example 1. Evaluation results of the obtained thick aluminum nitride single crystal layer 11 were: half width of the X-ray omega rocking curve of a (002) face (inclined crystal face): 15 arcsec, half width of the X-ray omega rocking curve of a (101) face (inclined crystal face): 14 arcsec, and half width of the X-ray omega rocking curve of a (103) face (specific crystal face): 62 arcsec. Since having been grown over the original base substrate 10, the obtained aluminum nitride single crystal layer 11 had almost the same crystallinity as that in Examples.

(Separation Step)

A layered body having the grown thick aluminum nitride single crystal layer 11 was separated into a cut base substrate 10a and an aluminum nitride single crystal layer 11a, the cut base substrate 10a including the base substrate 10 and the thin film 11b layered thereon, the thin film 11b being part of the aluminum nitride single crystal layer 11, and the aluminum nitride single crystal layer 11a being another part of the aluminum nitride single crystal layer 11, in the same manner as the separation step in Example 1. The cutting margin in cutting was 270 μm. The thickness of the aluminum nitride single crystal self-supporting substrate 11a was 610 μm.

(Renewing Polishing Step)

Since a saw mark was found on the surface on a base substrate side of the aluminum nitride self-supporting substrate 11a after cutting, the saw mark was removed to have a flat face exposed. Flat face exposure by diamond lap polishing, and CMP were carried out on a growth surface side of the aluminum nitride self-supporting substrate 11a as well, to remove a distortion layer. As a result of polishing by 50 μm for removing the saw mark on a cut face, and polishing by 80 μm on the growth surface side by CMP, the thickness of an aluminum nitride single crystal self-supporting substrate 11d after renewing polishing was 480 μm. Evaluation results of the aluminum nitride single crystal self-supporting substrate 11d were almost the same as those of the aluminum nitride single crystal layer 11 obtained on the base substrate 10 in the growth step: the crystal face direction of the main face was a (001) face, the offset angle of the main face in a m-axis direction was 0.31°, the offset angle of the main face in an a-axis direction was 0.03°, the radius of curvature of the surface of the substrate was 10 m, the surface roughness was 0.15 nm, the dislocation density (etch pit density) was $8\times10^4$ cm$^{-2}$, the X-ray omega rocking curve of a (002) face (inclined crystal face) had a half width of 16 arcsec, the X-ray omega rocking curve of a (101) face (inclined crystal face) had a half width of 13 arcsec, the X-ray omega rocking curve of a (103) face (specific crystal face) had a half width of 73 arcsec, and the radius of curvature of the (002) crystal face parallel to the main face was 11 m.

(Repetition Step; Using Aluminum Nitride Single Crystal Self-Supporting Substrate 11d as New Base Substrate)

The aluminum nitride single crystal self-supporting substrate 11d obtained in the renewing polishing step was used as a new base substrate instead of the renewed base substrate 10b or 10c in Example 1 or 2. On the aluminum nitride single crystal self-supporting substrate 11d, 950 μm of a new aluminum nitride single crystal layer 14 was grown under the same raw material supply conditions as were employed in the growth step except that the growth time was changed. Evaluation results of the obtained new aluminum nitride single crystal layer 14 were: half width of the X-ray omega rocking curve of a (002) face (inclined crystal face): 35 arcsec, half width of the X-ray omega rocking curve of a (101) face (inclined crystal face): 30 arcsec, and half width of the X-ray omega rocking curve of a (103) face (specific crystal face): 80 arcsec, which indicated slight deterioration of crystallinity compared to the thick aluminum nitride single crystal layer 11 grown over the original base substrate 10.

(Second Separation Step)

A layered body having the grown new aluminum nitride single crystal layer 14 was separated into a cut base substrate and a new aluminum nitride single crystal self-supporting substrate 14a, the cut base substrate including the aluminum nitride single crystal self-supporting substrate 11d and a thin film 14b layered thereon, the thin film 14b being part of the new aluminum nitride single crystal layer 14, and the new aluminum nitride single crystal self-supporting substrate 14a being another part of the new aluminum nitride single crystal layer 14, in the same manner as the separation step in Example 1. The cutting margin in cutting was 250 μm. The thickness of the new aluminum nitride single crystal self-supporting substrate 14a was 640 μm.

(Second Renewing Polishing Step)

Since a saw mark was found on the surface on a base substrate side of the aluminum nitride self-supporting substrate 14a after cutting, the saw mark was removed to have a flat face exposed. Flat face exposure by diamond lap polishing, and further CMP were also carried out on a growth surface side of the new aluminum nitride self-supporting substrate 14a, to remove a distortion layer. As a result of polishing by 65 μm for removing the saw mark on a cut face, and polishing by 90 μm on the growth surface side by CMP, the thickness of the aluminum nitride single crystal self-supporting substrate 14d after the renewing polishing was 485 μm. Evaluation results of the new aluminum nitride single crystal self-supporting substrate 14d were almost the same as those of the new aluminum nitride single crystal layer 14 obtained in the repetition step: the crystal face direction of the main face was a (001) face, the offset angle of the main face in a m-axis direction was 0.22°, the offset angle of the main face in an a-axis direction was 0.10°, the radius of curvature of the surface of the substrate was 12 m, the surface roughness was 0.14 nm, the dislocation density (etch pit density) was $9\times10^4$ cm$^{-2}$, the X-ray omega rocking curve of a (002) face (inclined crystal face) had a half width of 36 arcsec, the X-ray omega rocking curve of a (101) face (inclined crystal face) had a half width of 28 arcsec, the X-ray omega rocking curve of a (103) face (specific crystal face) had a half width of 77 arcsec, and the radius of curvature of the (002) crystal face parallel to the main face was 11 m.

Thereafter, the separation step, the renewing polishing step, and the repetition step were similarly carried out to iteratively use the aluminum nitride single crystal self-supporting substrate 14a, to grow an aluminum nitride single crystal layer 14'. That is, the following was repeated: a new aluminum nitride single crystal self-supporting substrate newly obtained in every separation step was used as a new base substrate, and a new aluminum nitride single crystal layer was grown over this new base substrate. The results thereof are summarized in Table 1. The increased number of the cycles of iterative use brought about deterioration of crystal qualities in the new aluminum nitride single crystal layer 14'. Deterioration in qualities was significant especially after the fourth cycle.

TABLE 1

| | Step | Evaluated properties | | Iterative use of base substrate (the original base substrate 10 was used in "1st") | | | | |
|---|---|---|---|---|---|---|---|---|
| | | | | 1st | 2nd | 3rd | 4th | 5th |
| Example 1 | Preparation step | Thickness of renewed base substrate (10b) [μm] | | 500 | 498 | 473 | 465 | 395 |
| | | Thickness of residual film of AlN single crystal layer (11c) [μm] | | — | 0 | 0 | 0 | 0 |
| | Growth step | Thickness of grown AlN single crystal layer (11 or 13) [μm] | | 860 | 1210 | 1030 | 650 | 560 |
| | | XRC half width of AlN single crystal layer (11 or 13) [arcsec] | (002) face | 13 | 12 | 13 | 12 | 14 |
| | | | (101) face | 12 | 11 | 12 | 12 | 11 |
| | | | (103) face | 54 | 53 | 48 | 50 | 59 |
| | Separation step | Thickness of residual film of AlN single crystal layer (11b) [μm] | | 80 | 180 | 150 | 30 | 5 |
| Example 2 | Preparation step | Thickness of renewed base substrate (10c) [μm] | | 500 | 504 | 580 | 545 | 501 |
| | | Thickness of residual film of AlN single crystal layer (11c) [μm] | | — | 4 | 80 | 45 | 1 |
| | Growth step | Thickness of grown AlN single crystal layer (11 or 13) [μm] | | 880 | 1170 | 835 | 910 | 885 |
| | | XRC half width of AlN single crystal layer (11 or 13) [arcsec] | (002) face | 18 | 20 | 27 | 43 | 19 |
| | | | (101) face | 14 | 15 | 21 | 28 | 14 |
| | | | (103) face | 60 | 66 | 62 | 79 | 65 |
| | Separation step | Thickness of residual film of AlN single crystal layer (11b) [μm] | | 90 | 160 | 110 | 70 | 20 |

| | Step | Evaluated properties | | Iterative growth on AlN single crystal layer side (the original base substrate 10 was used in "1st") | | | | |
|---|---|---|---|---|---|---|---|---|
| | | | | 1st | 2nd | 3rd | 4th | 5th |
| Comparative Example | Preparation step | Thickness of AlN single crystal self-supporting substrate (11d) [μm] | | 500 | 480 | 485 | 510 | 490 |
| | Growth step | Thickness of grown AlN single crystal layer (11 or 14) [μm] | | 960 | 950 | 1080 | 980 | 930 |
| | | XRC half width of AlN single crystal layer (11 or 14) [arcsec] | (002) face | 15 | 35 | 49 | 83 | 149 |
| | | | (101) face | 14 | 30 | 39 | 75 | 125 |
| | | | (103) face | 62 | 80 | 95 | 169 | 213 |
| | Separation step | Thickness of AlN single crystal self-supporting substrate (11a or 14a) [μm] | | 610 | 640 | 680 | 670 | 660 |

REFERENCE SIGNS LIST

10 base substrate
10a cut base substrate
10b renewed base substrate
10c renewed base substrate (including residual aluminum nitride single crystal thin film)
11 aluminum nitride single crystal layer
11a aluminum nitride single crystal self-supporting substrate
11b aluminum nitride single crystal thin film (residual layer after cutting)
11c aluminum nitride single crystal thin film (residual layer after renewing polishing)
11d aluminum nitride single crystal self-supporting substrate (after renewing polishing)
12 removed region by polishing
13 new aluminum nitride single crystal layer (growth layer on renewed base substrate)
14, 14' new aluminum nitride single crystal layer (growth layer on aluminum nitride self-supporting substrate)
14a new aluminum nitride self-supporting substrate (after cutting)
14b thin film that is part of new aluminum nitride single crystal layer (residual layer after cutting)
14d new aluminum nitride self-supporting substrate (after renewing polishing)
21 growth step
22 separation step
23 renewing polishing step
24 repetition step (growth on renewed base substrate)
300 vapor phase growth apparatus (HVPE apparatus)
30 reaction pipe
31 growth part reaction zone
32 susceptor
33 pushing carrier gas introduction part
34 exhaust outlet
35 raw material part outside heating means
36 growth part outside heating means
37 high frequency heating coil
38 raw material part reaction pipe
39 raw material-generating halogen-based gas introducing pipe
40 aluminum raw material
41 additional halogen-based gas introducing pipe
42 halogen-based raw material gas supply nozzle
43 nitrogen source gas introducing pipe
44 additional halogen-based gas (for nitrogen source gas) introducing pipe
45 nitrogen source gas introducing pipe

We claim:

1. A method for producing an aluminum nitride single crystal substrate, the method comprising:
   i) preparing a first base substrate consisting of a first aluminum nitride single crystal, the first base substrate having a main face;
   ii) growing a first aluminum nitride single crystal layer having a thickness of no less than 500 μm over the main face of the first base substrate, to obtain a layered body comprising the first base substrate and the first aluminum nitride single crystal layer grown over the main face of the first base substrate, wherein the ii) comprises supplying an aluminum source and a nitrogen source onto the main face of the first base substrate;

iii) cutting the first aluminum nitride single crystal layer of the layered body, to separate the layered body into a second base substrate and a first part of the first aluminum nitride single crystal layer, the second base substrate comprising the first base substrate and a thin film layered thereon, the thin film being a second part of the first aluminum nitride single crystal layer;

iv) polishing a surface of the thin film in the second base substrate, to obtain a third base substrate consisting of a second aluminum nitride single crystal; and v) growing a second aluminum nitride single crystal layer over the polished surface of the third base substrate;

wherein an X-ray omega rocking curve of an inclined crystal face of the first base substrate has a half width of no more than 100 arcsec, wherein the X-ray omega rocking curve of the inclined crystal face is measured under a condition that an incident angle between an incident X-ray and the main face of the first base substrate is no less than 10°.

2. The method according to claim 1,
wherein the main face of the first base substrate is a (001) face, a (010) face, or a (100) face.

3. The method according to claim 1,
wherein the thin film in the second base substrate has a thickness of 1 to 300 μm.

4. The method according to claim 1,
wherein the third base substrate comprises the thin film which has been polished in the iv); and
the polished thin film has a thickness of no more than 100 μm.

5. The method according to claim 1,
wherein the iv) comprises removing all of the thin film by polishing, such that the first base substrate is exposed on a surface.

6. The method according to claim 1,
wherein the first base substrate has a dislocation density of no more than $10^6$ cm' in the main face.

7. The method according to claim 1,
wherein the main face of the first base substrate is a (001) face, a (100) face, or a (110) face;
an X-ray omega rocking curve of a specific crystal face has a half width of no more than 200 arcsec, wherein the X-ray omega rocking curve is measured under a condition that an incident angle between an incident X-ray and the main face is no more than 4°;
when the main face is the (001) face, the specific crystal face is a (103) face;
when the main face is the (100) face, the specific crystal face is a (106) face; and
when the main face is the (110) face, the specific crystal face is a (114) face.

8. The method according to claim 1,
wherein the aluminum source is an aluminum halide gas; and
the nitrogen source is ammonia gas.

9. The method according to claim 1,
wherein the main face of the first base substrate is a (001) vicinal face inclined from the (001) face at a first inclination angle of 0.00 to 1.00° to a m-axis and at a second inclination angle of 0.00 to 1.00° to an a-axis; and
at least one of the first and second inclination angles is greater than 0.00°.

10. The method according to claim 1,
wherein the v) comprises carrying out the i) to iv) using the third base substrate as a new first base substrate.

11. The method according to claim 1, further comprising: repeating the v).

12. The method according to claim 1,
wherein the iii) comprises cutting the first aluminum nitride single crystal layer by means of a wire saw.

13. The method according to claim 1,
wherein the main face of the first base substrate is a (001) face, a (110) face, or a (100) face;
if the main face is the (001) face, the inclined crystal faces are a (002) face and a (101) face, and the X-ray omega rocking curves of the inclined crystal faces have a half width of no more than 100 arcsec respectively for both of the (002) face and the (101) face;
if the main face is the (110) face, the inclined crystal faces are a (110) face and a (111) face, and the X-ray omega rocking curves of the inclined crystal faces have a half width of no more than 100 arcsec respectively for both of the (110) face and the (111) face; and
if the main face is the (100) face, the inclined crystal faces are a (100) face and a (201) face, and the X-ray omega rocking curves of the inclined crystal faces have a half width of no more than 100 arcsec respectively for both of the (100) face and the (201) face.

* * * * *